(12) United States Patent
Goddard et al.

(10) Patent No.: US 11,664,195 B1
(45) Date of Patent: May 30, 2023

(54) DC PLASMA CONTROL FOR ELECTRON ENHANCED MATERIAL PROCESSING

(71) Applicant: VELVETCH LLC, Pasadena, CA (US)

(72) Inventors: William Andrew Goddard, Pasadena, CA (US); Stewart Francis Sando, St. Petersburg, FL (US); Samir John Anz, La Crescenta, CA (US); David Irwin Margolese, Pomona, CA (US)

(73) Assignee: VELVETCH LLC, Pasadena, CA (US)

( * ) Notice: Subject to any disclaimer, the term of this patent is extended or adjusted under 35 U.S.C. 154(b) by 0 days.

(21) Appl. No.: 17/524,330

(22) Filed: Nov. 11, 2021

(51) Int. Cl.
*H01J 37/32* (2006.01)

(52) U.S. Cl.
CPC .. *H01J 37/32027* (2013.01); *H01J 37/32596* (2013.01)

(58) Field of Classification Search
None
See application file for complete search history.

(56) References Cited

U.S. PATENT DOCUMENTS

| | | |
|---|---|---|
| 4,464,223 A | 8/1984 | Gorin |
| 4,756,794 A | 7/1988 | Yoder |
| 5,039,376 A | 8/1991 | Zukotynski et al. |
| 5,882,538 A | 3/1999 | Martin et al. |
| 5,917,285 A | 6/1999 | Gillis et al. |
| 6,027,663 A | 2/2000 | Martin et al. |
| 6,033,587 A | 3/2000 | Martin et al. |
| 6,048,435 A | 4/2000 | DeOrnellas et al. |
| 6,258,287 B1 * | 7/2001 | Martin ............. B08B 7/0035 438/731 |
| 6,335,536 B1 * | 1/2002 | Goeckner ......... H01J 37/32009 250/492.23 |
| 6,646,386 B1 | 11/2003 | Sirkis et al. |
| 6,720,268 B1 | 4/2004 | Laermer et al. |
| 6,852,195 B2 | 2/2005 | Martin et al. |
| 6,884,717 B1 | 4/2005 | Desalvo et al. |
| 7,431,796 B2 | 10/2008 | Martin et al. |
| 7,777,197 B2 | 8/2010 | Al-Bayati et al. |

(Continued)

FOREIGN PATENT DOCUMENTS

JP 4838736 B2 12/2011

OTHER PUBLICATIONS

Anz S. et al., "Etching with Electrons" Compound Semiconductor, vol. 26 Issue 5, Jul. 2020, pp. 1-6.

(Continued)

*Primary Examiner* — Jason Berman
(74) *Attorney, Agent, or Firm* — Steinfl + Bruno LLP

(57) ABSTRACT

Systems and methods for material processing using wafer scale waves of precisely controlled electrons in a DC plasma is presented. The anode and cathode of a DC plasma chamber are respectively connected to an adjustable DC voltage source and a DC current source. The anode potential is adjusted to shift a surface floating potential of a stage in a positive column of the DC plasma to a reference ground potential of the DC voltage/current sources. A control loop can be activated throughout various processing steps to maintain the surface floating potential of the stage to the reference ground potential. A signal generator referenced to the ground potential is capacitively coupled to the stage to control a surface potential at the stage for provision of kinetic energy to free electrons in the DC plasma.

19 Claims, 15 Drawing Sheets

(56) References Cited

U.S. PATENT DOCUMENTS

| | | | |
|---|---|---|---|
| 9,245,752 | B2 | 1/2016 | Yeom et al. |
| 9,620,382 | B2 | 4/2017 | Oehrlein et al. |
| 10,368,427 | B2 | 7/2019 | Morrisroe |
| 10,504,742 | B2 | 12/2019 | Zaitsu et al. |
| 11,239,094 | B2 | 2/2022 | Kanarik |
| 2001/0019745 | A1 | 9/2001 | Beele et al. |
| 2004/0163763 | A1 | 8/2004 | Martin et al. |
| 2009/0057135 | A1 | 3/2009 | Fujii et al. |
| 2014/0076716 | A1* | 3/2014 | Gorokhovsky ......... C23C 14/35 204/192.12 |
| 2016/0293432 | A1 | 10/2016 | Ranjan et al. |
| 2017/0062190 | A1 | 3/2017 | Lee et al. |
| 2018/0226225 | A1 | 8/2018 | Koh et al. |
| 2019/0267211 | A1 | 8/2019 | Pan et al. |

OTHER PUBLICATIONS

Barden M. "Plasma Process for Surface Treatment of Implants" *Medical Design Briefs*, Jun. 2020, pp. 1, 12-14.

Elliot J. "Treating Titanium and Polymer with Plasma Processing" *U.S. Tech*, vol. 35 No. 12, Dec. 2020, 2 pages.

Gillis H.P. et al., "Damage-free Pattern Transfer by Low Energy Electron Enhanced Etching (LE4): Mechanisms and Applications" *ECS Transactions*, 2008, vol. 13 No. 8, pp. 35-46.

Gillis H.P. et al., "Highly Anisotropic, Ultra-Smooth Patterning of GaN/SiC by Low Energy Electron Enhanced Etching in DC Plasma" Journal of Electronic Materials, vol. 26 No. 3, 1997, pp. 301-305.

Gillis H.P. et al., "Low energy electron-enhanced etching of GaAs (100) in a chlorine/hydrogen de plasma" *Appl. Phys. Lett.*, 68(16), Apr. 1996, pp. 2255-2257.

Gillis H.P. et al., "Low energy electron-enhanced etching of Si(100) in hydrogen/helium direct-current plasma" *Appl. Phys. Lett.*, 66(19), May 1995, pp. 2475-2477.

Gillis H.P. et al., "Low-energy electron beam enhanced etching of Si(100)-(2x1) by molecular hydrogen" *J. Vac. Sci. Technol. B*, Aug. 1992, vol. 10 No. 6, pp. 2729-2733.

Gillis H.P. et al., "Precision, Damage-Free Etching by Electron-Enhanced Reactions: Results and Simulations" *ECS Transactions*, 50(46), Dec. 2013, pp. 33-43.

Kim J. et al., "Low-Energy Electron-Enhanced Etching of HgCdTe" *Journal of Electronic Materials*, vol. 32 No. 7, Jan. 2003, pp. 677-685.

Lee S.H. et al., "Morphological evolution of III-V semiconductors and SiO2 during low energy electron enhanced dry etching" *Journal of Vacuum Science & Technology A*, Jul. 2004, vol. 22 No. 4, pp. 1600-1605.

Morling R. "New plasma process delivers superior surface treatment of titanium and polymer implants" Design Solutions, Mar. 2020, 2 pages.

Veprek S. et al., "Electron-Impact-Induced Anisotropic Etching of Silicon by Hydrogen" Plasma Chemistry and Plasma Processing, vol. 2 No. 3, Jun. 1982, pp. 233-246.

Webb A.P. et al., "Reactivity of Solid Silicon with Hydrogen under conditions of a low pressure plasma" Chemical Physics Letters, vol. 62 No. 1, Mar. 1979, pp. 173-177.

Winningham T. A. et al., "Formation of ordered nanocluster arrays by self-assembly on nanopatterned Si(100) surfaces" *Surface Science*, vol. 406, 1998, pp. 221-228.

Huard C. M. et al., "Atomic layer etching of 3D structures in silicon: Self-limiting and nonideal reactions" *J. Vac. Sci. Technol.*, vol. 35 No. 3, Jun. 2017 15 pages.

Nojiri K. "Atomic layer etching of GaN and AlGaN using plasma-enhanced approach" *ResearchGate*, Mar. 2018, 3 pages.

Restriction Requirement for U.S. Appl. No. 17/668,301, filed Feb. 9, 2022 on behalf of Velvetch LLC. dated Jul. 15, 2022 7 pages.

Second Restriction Requirement for U.S. Appl. No. 17/668,301, filed Feb. 9, 2022, on behalf of Velvetch LLC. dated Aug. 26, 2022. 6 Pages.

Wang X. et al., "Scaling of atomic layer etching of SiO2 in fluorocarbon plasmas: Transient etching and surface roughness" *J. Vac. Sci. Technol.*, vol. 39 No. 3, Jun. 2021, 18 pages.

Non-Final Office Action for U.S. Appl. No. 17/946,434, filed Sep. 16, 2022, on behalf of Velvetch LLC, dated Dec. 21, 2022, 16 pages.

Anz, Samir J. et al., "Damage-Free Atomic-Scale Etching and Surface Enhancements by Electron-Enhanced Reactions: Results and Simulations", Chapter 26 of "Computational Materials, Chemistry, and Biochemistry: From Bold Initiatives to the Late Mile" *Springer Series in Materials Science*, vol. 284, Jan. 2021, 30 pages.

Non-Final Office Action for U.S. Appl. No. 17/942,808, filed Sep. 12, 2022 on behalf of Velvetch LLC; dated Dec. 14, 2022;16 pages.

Non-Final Office Action for U.S. Appl. No. 17/668,301, filed Feb. 9, 2022 on behalf of Velvetch LLC, dated Nov. 3, 2022, (20 pages).

* cited by examiner

DC PLASMA CONTROL FOR ELECTRON ENHANCED MATERIAL PROCESSING

TECHNICAL FIELD

The present disclosure generally relates to systems and methods for producing operating conditions in a DC plasma reaction chamber used for material processing, in particular, for material processing using wafer scale waves of precisely controlled electrons in a DC plasma at room temperatures (or other temperatures if desired).

BACKGROUND

Fabrication of, for example, integrated circuits, may include processing of corresponding substrates within a (direct-current) DC plasma reaction chamber wherein electrons and/or ions are accelerated towards the surface of the substrate to initiate a reaction that physically transforms the surface of the substrate. In some cases, and mainly due to their relatively smaller mass of electrons compared to ions, substrate processing via electrons may be preferred so as to reduce any damage to the surface of the substrate beyond the targeted physical alterations expected by the processing step per se.

In some cases, plasma processing may include arrangement of the substrate in a region of the DC plasma reaction chamber such that an exact value of a surface floating potential of the substrate is not known. Accordingly, any externally applied bias signal to the substrate may impart an energy to free electrons in a region of the plasma close to the surface of the substrate that may not correlate to the electron energy thresholds/levels of (atoms) materials present at the surface of the substrate. Teachings according to the present disclosure produce operating conditions in the DC plasma chamber that allow for precise control of the energy of the free electrons to specifically target electron energy thresholds of the materials present at the surface of the substrate.

SUMMARY

Systems and methods for material processing using wafer scale waves of precisely controlled electrons in a DC plasma at room temperatures (or other temperatures if desired) are presented. In the present disclosure such material processing is referred to as electron enhanced material processing (EEMP) which allows precise control of the kinetic energy of free electrons in the DC plasma to exactly (and selectively) target energy levels of atoms at the surface of a substrate being processed.

According to one embodiment the present disclosure, a direct-current (DC) plasma system for processing of a substrate is presented, the DC plasma system comprising: a DC plasma reaction chamber configured to contain a DC plasma that is generated between an anode and a cathode of the DC plasma reaction chamber; an adjustable DC voltage source having an output that is electrically coupled to the anode; a DC current source that is electrically coupled to the cathode; and a substrate support stage arranged in a region of the DC plasma reaction chamber that contains a positive column of the DC plasma, wherein the adjustable DC voltage source and the DC current source are electrically coupled to a reference ground, and wherein during a processing step of the substrate, the adjustable DC voltage source adjusts an electrical potential at the anode to set a floating potential at a surface of the substrate support stage to a potential of the reference ground.

According to a second embodiment of the present disclosure, a method for processing a surface of a substrate is presented, the method comprising: placing a substrate support stage in a region of a DC plasma reaction chamber configured to produce a positive column of the DC plasma; generating a DC plasma by coupling an adjustable DC voltage source and a DC current source respectively to an anode and a cathode of the DC plasma reaction chamber; based on the generating, producing a floating potential at a surface of the substrate support stage; adjusting a potential at the anode via the adjustable DC voltage source while maintaining via the DC current source a constant DC current between the anode and the cathode; and based on the adjusting and the maintaining, setting the floating potential to a specific potential of a reference ground of the adjustable DC voltage source.

Further aspects of the disclosure are shown in the specification, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Figure 1A:
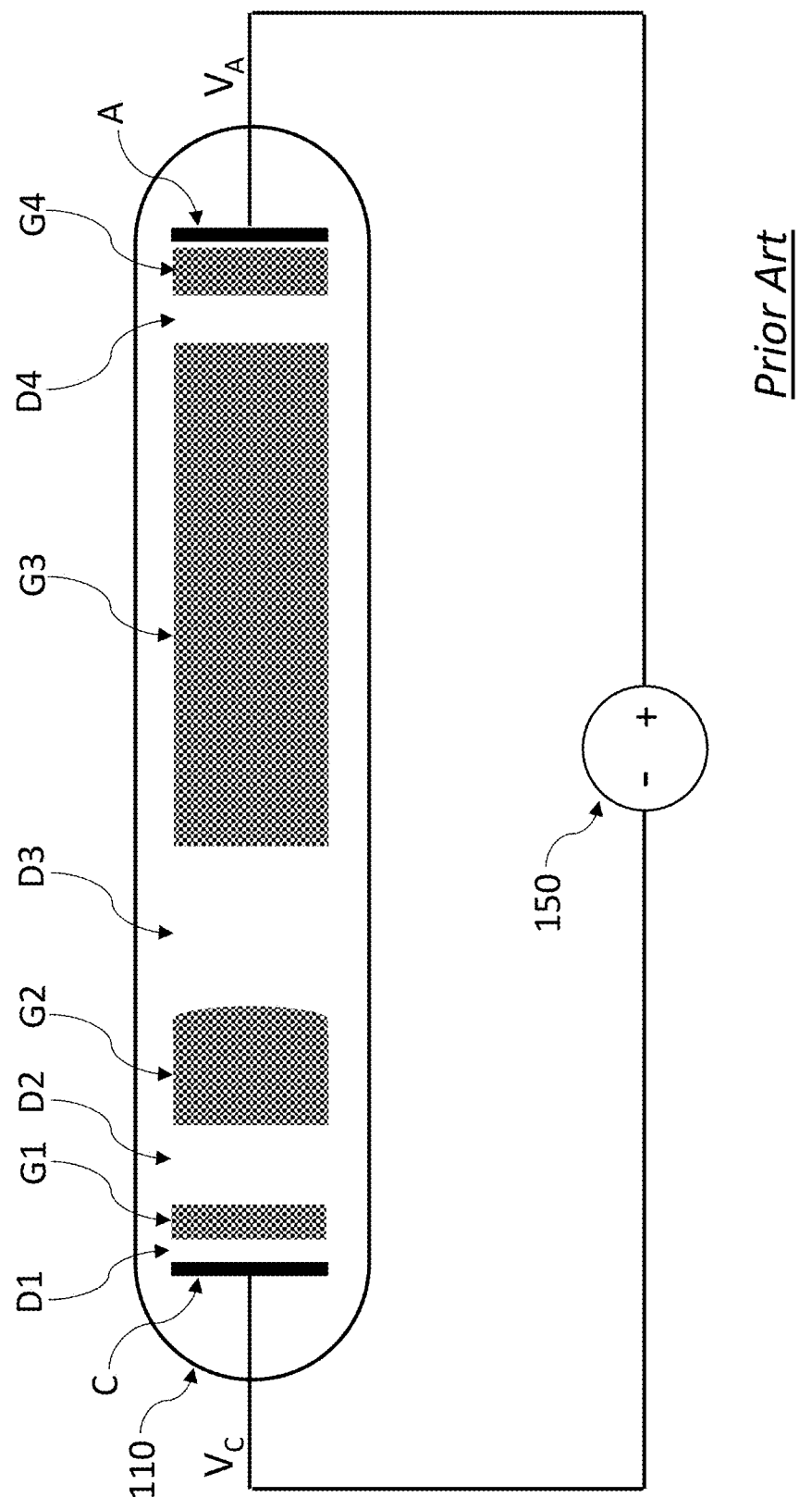
FIG. 1A shows a simplified schematic view of a DC plasma reaction chamber that can be used in a DC plasma processing system.

FIG. 1A shows a simplified schematic view of a prior art (direct-current) DC plasma reaction chamber (110) that can be used in a DC plasma processing system. Biasing of the DC plasma reaction chamber (110) may be provided by a DC voltage source (150) coupled between an anode, A, and a cathode, C, of the DC plasma reaction chamber (110). During operation, a glow discharge (plasma) may be formed in the chamber (110) based on interaction of a gas and electrons of a current that flows between the anode, A, and the cathode, D. This in turn produces free ions and electrons in the chamber (110). The principle of operation of such DC plasma reaction chamber (110) is well known to a person skilled in the art and therefore related details are omitted in the present disclosure.

As shown in FIG. 1A, the glow discharge formed in the chamber (110) may include glow regions (G1, G2, G3, G4) that emit significant light, and dark regions (D1, D2, D3, D4) that may not emit light. Such regions may represent different operating characteristics of the DC plasma reaction chamber (110), including, for example, temperature and electric potential.

Figure 1B:
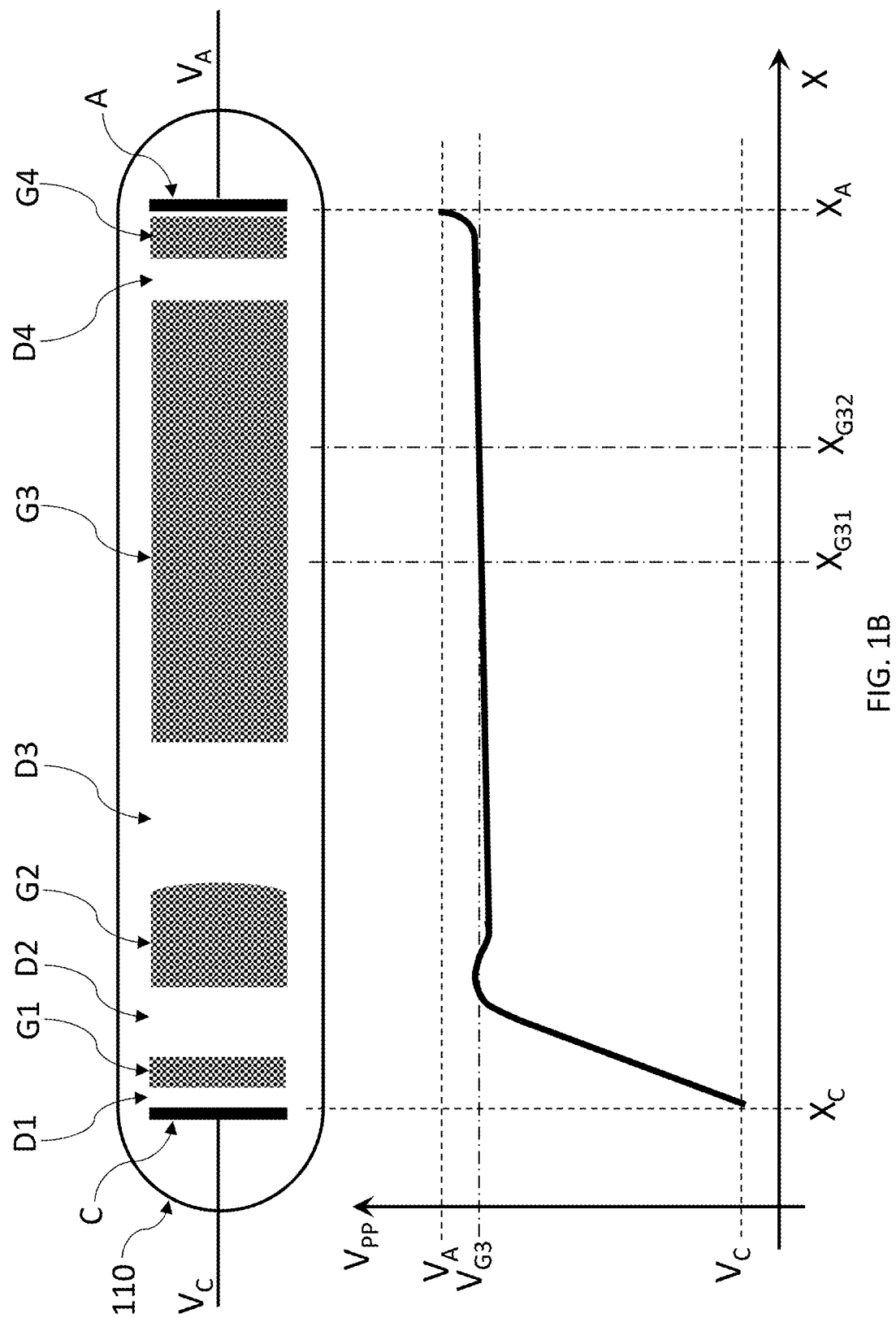
FIG. 1B shows a graph representative of a variation in (electric) potential of the plasma during operation of the DC plasma reaction chamber of FIG. 1A.

FIG. 1B shows a graph representative of a variation in the (electric) potential, $V_{PP}$, of the plasma along an axial direction (direction of longitudinal extension), X, of the chamber (110) during operation. As shown in FIG. 1B, the plasma potential, $V_{PP}$, varies from a value, $V_C$, that represents the potential applied to the cathode, C, by the DC voltage source (150 of FIG. 1A), to a value, $V_A$, that represents the potential applied to the anode, A, by the DC voltage source (150 of FIG. 1A). It should be noted that as shown for example in FIG. 1D later described, generally the value, $V_A$, is at zero volts (e.g., reference ground) and the value, $V_C$, is negative (e.g., in a range of about 0 (zero)-500 volts).

With continued reference to FIG. 1B, abrupt variation of the potential, $V_{PP}$, in the regions (e.g., D1, G1, D2) close to the cathode, C, and in the regions (e.g., G4) close to the anode, A, may correspond to regions of higher operating temperatures of the chamber (110). On the other side, the region G3, also known as the positive column, is a region of quasi uniform/constant potential, $V_{PP}$, and of lower operating temperature. For example, considering a segment [$X_{G31}$, $X_{G32}$] along the axial direction, X, of the chamber (110) that as shown in FIG. 1B is contained within the positive column region, G3, a variation of the plasma potential, $V_{PP}$, across such segment [$X_{G31}$, $X_{G32}$] is minimal, or in other words, the potential, $V_{PP}$, across the segment [$X_{G31}$, $X_{G32}$] may be considered as constant. Accordingly, as shown in FIG. 1B, the plasma potential, $V_{PP}$, across the segment [$X_{G31}$, $X_{G32}$] may be considered as equal to a value $V_{G3}$. The lower operating temperature and the constant potential value of the plasma in the positive column region, G3, allow use of such region for processing of substrates as shown in FIG. 1C and FIG. 1D.

Figure 1C:
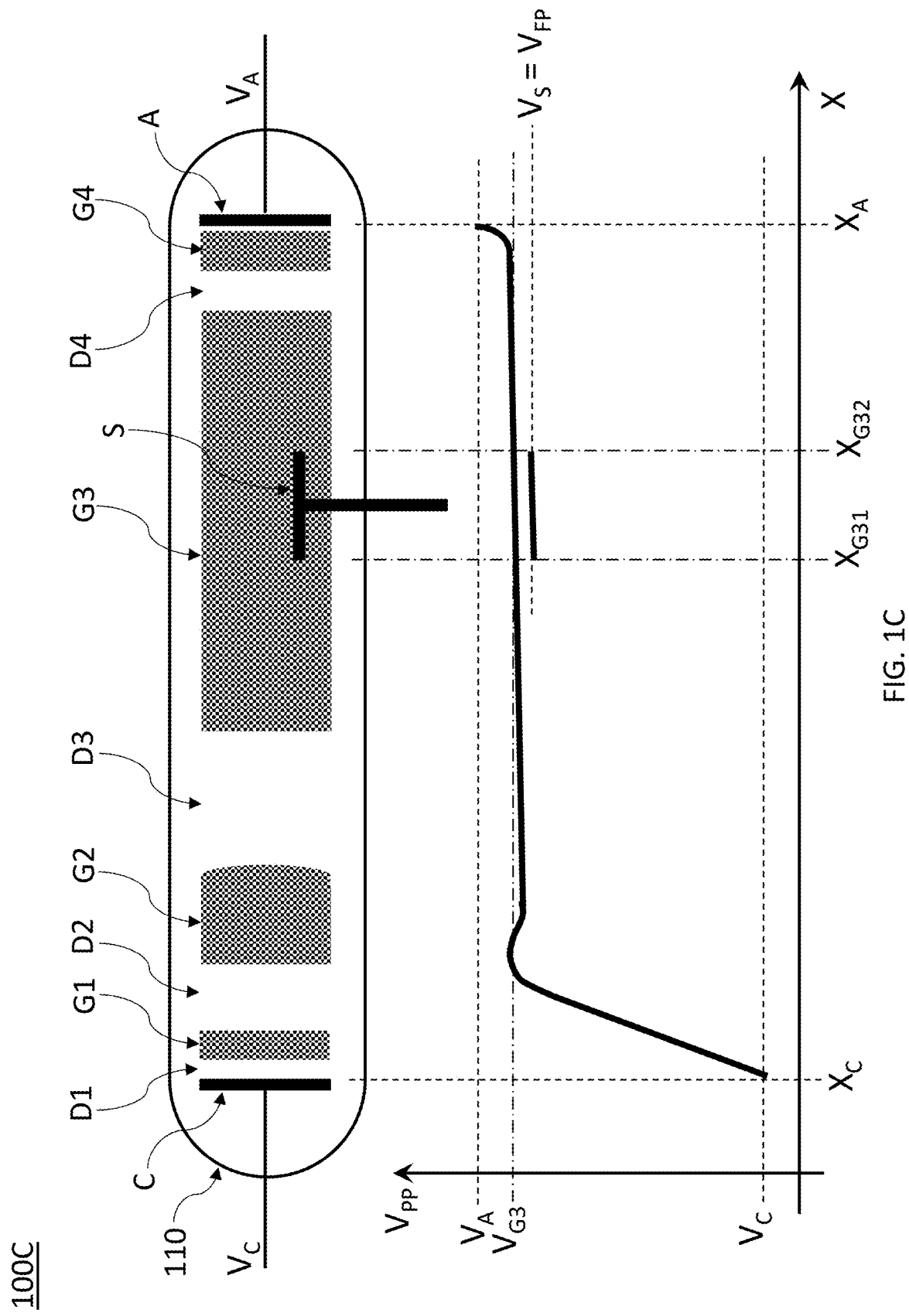
FIG. 1C shows a simplified schematic view of a DC plasma processing system comprising a (substrate) stage arranged in a region of the DC plasma reaction chamber of FIG. 1A.

FIG. 1C shows a simplified schematic view of a DC plasma processing system (100C) comprising a (substrate) stage, S, arranged in the positive column region, G3, of the DC plasma reaction chamber (110). The stage, S, may be designed to support a flat substrate, and therefore may include a top flat/planar surface. The stage, S, shown in FIG. 1C is electrically isolated (not connected to any external electric potential) and therefore, and as known to a person skilled in the art, in the presence of the plasma potential, $V_{PP}$, a potential, $V_S$, develops at the surface of the stage, S, that is referred to as the surface floating potential, $V_{FP}$. The relationship of the (surface) floating potential, $V_{FP}$, to the plasma potential, $V_{PP}$, is shown FIG. 1C. In particular, as shown in FIG. 1C, the plasma potential, $V_{PP}$, at a region [$X_{G31}$, $X_{G32}$] of the chamber (110) where the stage, S, is arranged is equal to $V_{G3}$, and the floating potential, $V_{FP}$, is lower than (negative with respect to) the plasma potential $V_{G3}$.

The floating potential, $V_{FP}$, shown in the graph of FIG. 1C can be attributed to the "plasma sheath" that develops in the presence of the stage, S. As known to a person skilled in the art, at the wall or any barrier within the plasma, a negative potential develops with respect to the bulk of the plasma. Consequently, an equilibrium potential drop develops between the bulk of the plasma and the wall or barrier. Such potential drop is confined to a small region of space next to the wall or barrier due to the charge imbalance that develops between the plasma and the wall or barrier. This layer of charge imbalance has a finite thickness, characterized by the Debye Length, and is called the "plasma sheath" or "sheath". The thickness of such a layer is several Debye lengths thick, a value whose size depends on various characteristics of the plasma. If the dimensions of the bulk plasma (e.g., chamber 110) are much greater than the Debye length, for example, then the Debye length depends on the plasma temperature and electron density. In the particular case of the DC plasma operating conditions supported by the teachings according to the present disclosure (e.g., EEMP system near room temperature to moderately above room temperature), the Debye length is in the order of several millimeters (e.g., less than 10 millimeters), and the difference between the potentials $V_{G3}$ and $V_{FP}$ is in the order of several volts (e.g., less than 10 volts). It should be noted that the plasma sheath may develop in the presence of any wall or barrier, whether conductive or not. Accordingly, once a substrate (whether conductive or insulating) is placed atop the stage, S, the same floating potential, $V_{FP}$, as described above with reference to FIG. 1C may develop at the surface of the substrate.

Figure 1D:
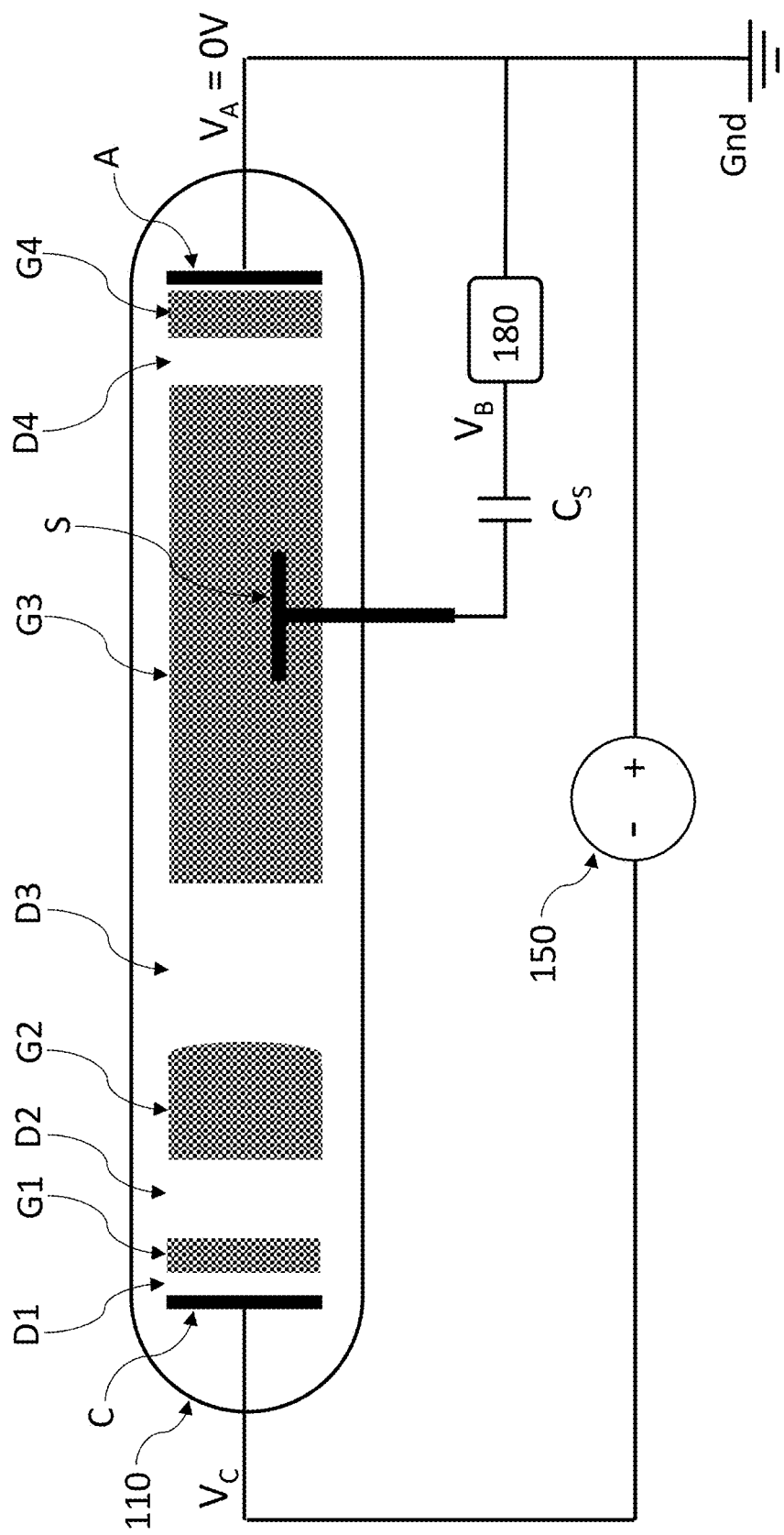
FIG. 1D shows an exemplary biasing of the stage of the DC plasma processing system of FIG. 1C via an external biasing signal generator.

FIG. 1D shows an exemplary biasing of the stage, S, of the DC plasma processing system of FIG. 1C via an external biasing signal generator (180) that is capacitively coupled to the stage, S, by a capacitor $C_S$. In the exemplary configuration (100D) shown in FIG. 1D, the potential, $V_A$, applied to the anode, A, is at zero volts (e.g., coupled to the reference ground, Gnd). Furthermore, as shown in FIG. 1D, a biasing signal, $V_B$, applied to the stage, S, by the external biasing signal generator (180) may be referenced to the reference ground potential, Gnd. Although in some prior art implementations the biasing signal, $V_B$, may be DC coupled to the stage, S, teachings according to the present disclosure strictly prohibit such DC coupling to the stage so as to avoid a discharge path for a DC current through any intermediate points in the chamber (110), as such discharge path may substantially change operating conditions within the chamber (110).

In the DC plasma processing system shown in FIG. 1D, the biasing signal, $V_B$, may be used to control a potential (e.g., surface potential $V_S$) seen by free electrons and/or ions in the vicinity of the stage, S, or of the substrate when present. Accordingly, energy of the free electrons and/or ions may be controlled to levels required for processing of the substrate. For example, as shown in the left-side graph of FIG. 1E, the biasing signal, $V_B$, generated by the external biasing signal generator (e.g., 180 of FIG. 1D) may start from zero and reach in a short period of time (represented by a leading edge slope) a voltage amplitude, $V_{B1}$. When the voltage amplitude, $V_{B1}$, is applied (e.g., AC coupled) to the stage, S, during a processing step (a) as shown in the top right-side graph of FIG. 1E, the voltage amplitude, $V_{B1}$, gets added (or subtracted if negative) to the surface floating potential, $V_{FPa}$, to generate a surface potential, $V_S$, at the vicinity of the stage, S. However, because the free electrons and/or ions are at the plasma potential, $V_{PPa}$, only a portion of the surface potential, $V_S$, that is above the plasma potential, $V_{PPa}$, is seen by the free electrons and/or ions. For example, as shown in the top right-side graph of FIG. 1E, the (kinetic) energy of the free electrons and/or ions may be based on a potential difference $V_{KEa}=(V_{B1}-\Delta V_{FPa})$, with $\Delta V_{FPa}, =(V_{PPa}-V_{FPa})$.

Figure 1E:
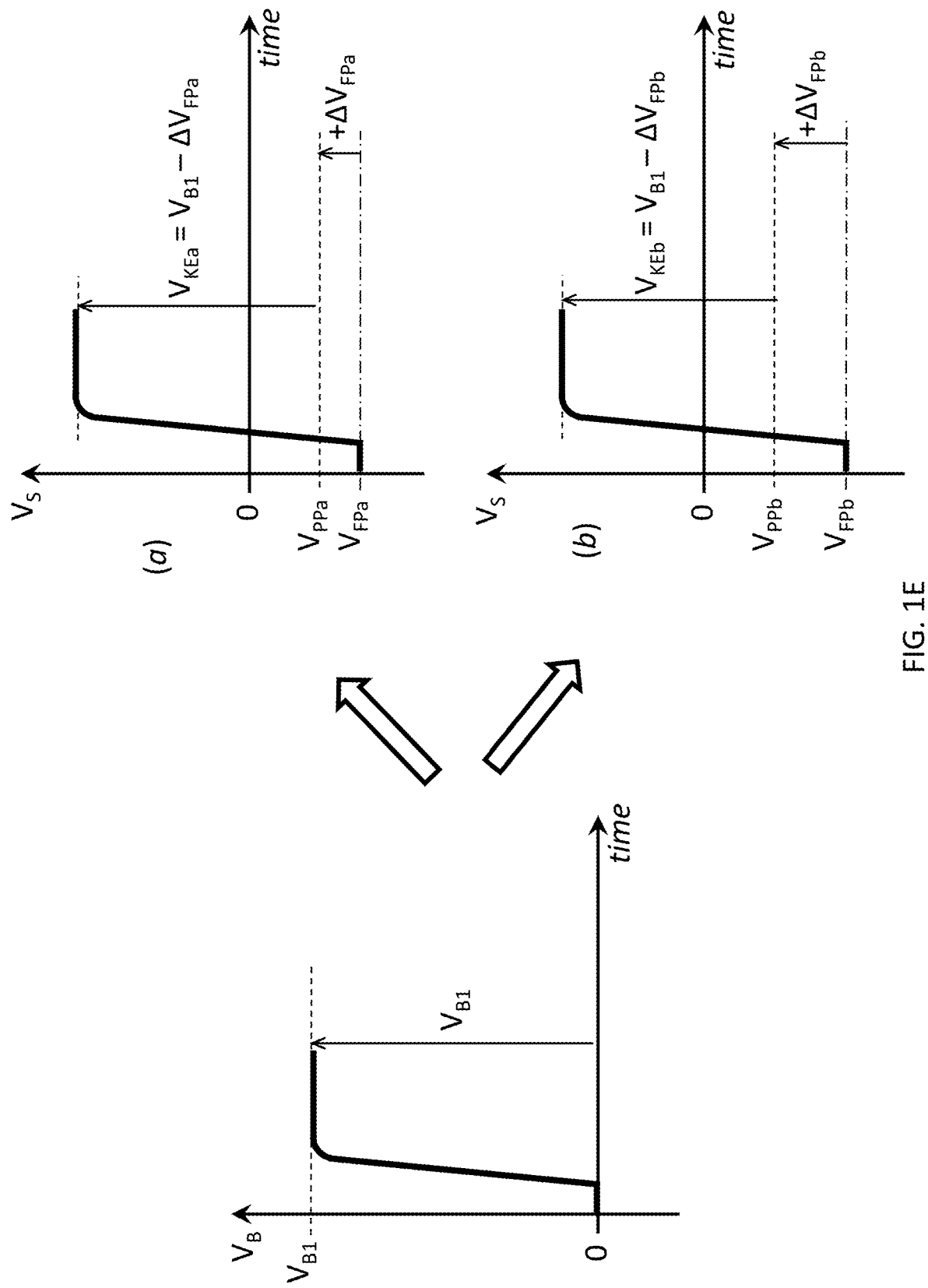
FIG. 1E shows an exemplary biasing signal generated by the external biasing signal generator of FIG. 1D and a corresponding potential generated at the surface of the stage.

On the other hand, considering a processing step (b) represented by the bottom right-side graph of FIG. 1E, which may have operating conditions that are different from the operating conditions of the processing step (a), including for example, a different plasma potential, $V_{PPb}$, or a different floating potential, $V_{PPb}$, that may cause a different differential $\Delta V_{FPb}, =(V_{PPb}-V_{FPb})$, then for the same applied voltage amplitude, $V_{B1}$, a different (kinetic) energy of the free electrons and/or ions is obtained. Teachings according to the present disclosure either eliminate variations in the operating conditions within the chamber (e.g., 110 of FIG. 1D), and/or compensate for such variations such as to allow, for example, precise control of the energy of the free electrons (and/or ions). It should be noted that variation in the operating conditions may be expected in view of different types of processing (e.g., (a) and (b) of FIG. 1E) performed within the chamber (110), including for example, etching of a substrate with different reactive gasses, cleaning of a substrate or any other process that may alter and/or remove composition/material from the surface of the substrate. It should be noted that, as known by a person skilled in the art, the different operating conditions for performing the different types of processing may further include corresponding variations and/or adjustments to any one of the DC plasma current, temperature, gas mixture or flow rate within the chamber (110).

When a substrate is placed atop the surface of the stage, S, the kinetic energy of the free electrons and/or ions acquired through the application of the bias signal, $V_B$, described above may accelerate the free electrons and/or ions towards the surface of the substrate and collide with the substrate to release the kinetic energy onto atoms at the surface of the substrate. Those atoms however are at an energy level that is based on the potential within which they reside, or in other words, based on the floating potential, $V_{FP}$. Various energy levels of one such atom for the processing type (a) described above with reference to FIG. 1E are shown in FIG. 1F, including the energy level, $E_n$, of a nucleus of an atom at the surface of the substrate, the energy level, $E_B$, of an electron bound to the nucleus of an atom at the surface of the substrate, and the energy level, $E_e$, of an electron at the orbit of an electron bound to a nucleus at the surface of the substrate.

Figure 1F:
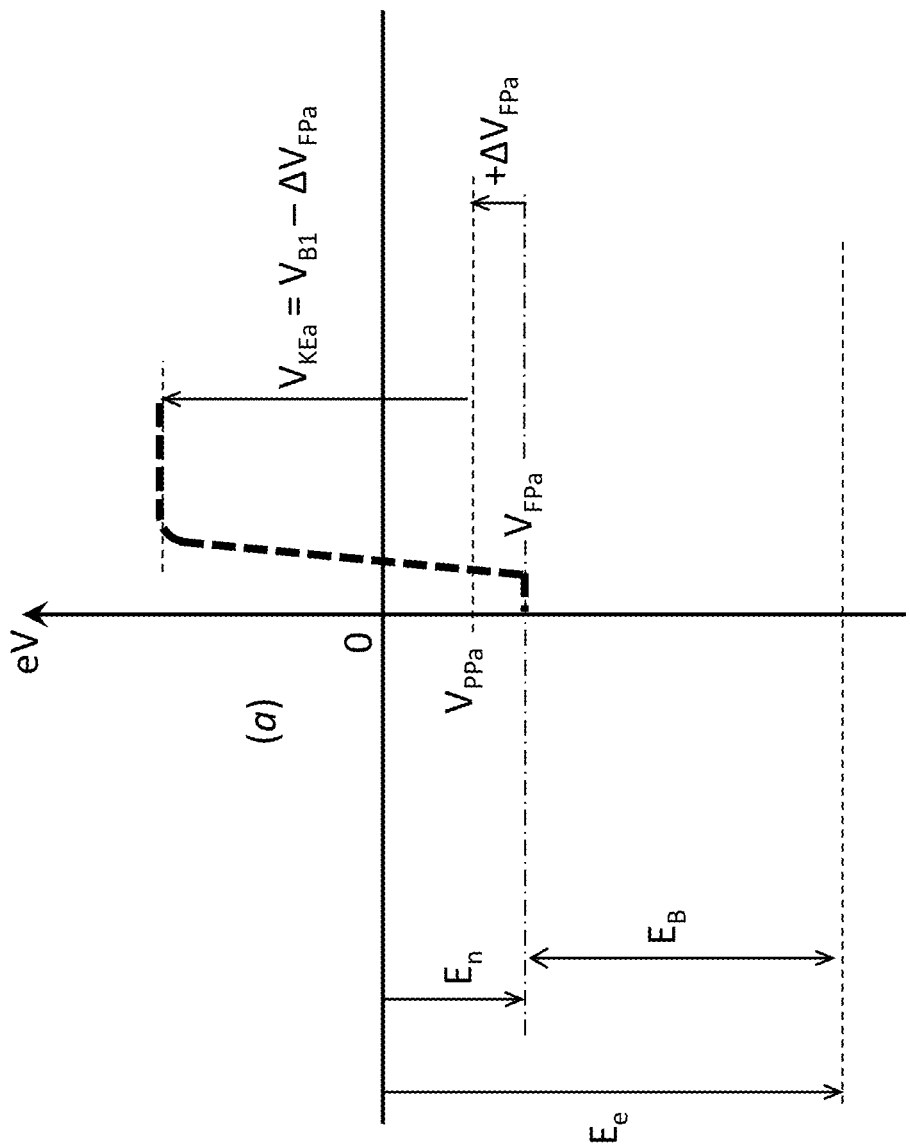
FIG. 1F shows exemplary energy levels of atoms at a surface of the stage.

As can be seen in FIG. 1F, the energy level, $E_n$, of the nucleus is at the (negative) potential, $V_{FPa}$, and the energy level, $E_e$, of the electron is at the (negative) potential $(E_n+E_B)$. In other words, in order to excite the atom to a level that breaks the bond between the electron and the nucleus, an energy equal to, or greater than, the energy level, $E_e$, of the electron must be imparted onto the atom. Accordingly, considering a plasma processing only via the free electrons, the kinetic energy of the free electrons provided through application of the bias signal, $V_B$, represented in FIG. 1F by the potential difference $V_{KEa}=(V_{B1}-\Delta V_{FPa})$ must be equal to, or greater than, the energy level, $E_e$. However, since $E_e=(E_n+E_B)$ and $E_n$ is based on the a priori unknown floating potential, $V_{FPa}$, precise control of the kinetic energy of the free electrons to precisely target the energy level, $E_e$, may not be possible.

Although the floating potential (e.g., $V_{FPa}$ of FIG. 1F) may be empirically and/or experimentally determined for a given process at stable operating conditions of the DC plasma chamber, any inconsistencies and/or lack of repeatability of such operating conditions may invalidate the determined floating potential. Furthermore, as different types of processes inherently yield to different floating potentials, the task of precisely controlling the kinetic energy of the free electrons to exactly target the energy level of an atom at the surface of the substrate may not be feasible. As a result, some prior art implementations impart kinetic energies onto the atoms at the surface of the substrate that may be substantially larger than a target atom energy level, and therefore may not allow for selectivity (as atoms of different materials/compositions having different energy levels may equally be subjected to energy levels sufficient to break their orbital bonds). The electron enhanced material processing (EEMP) according to the teachings of the present disclosure overcome such shortcoming and therefore allow precise control of the kinetic energy of the free electrons to exactly and selectively target the energy level of an atom at the surface of the substrate.

Figure 2A:
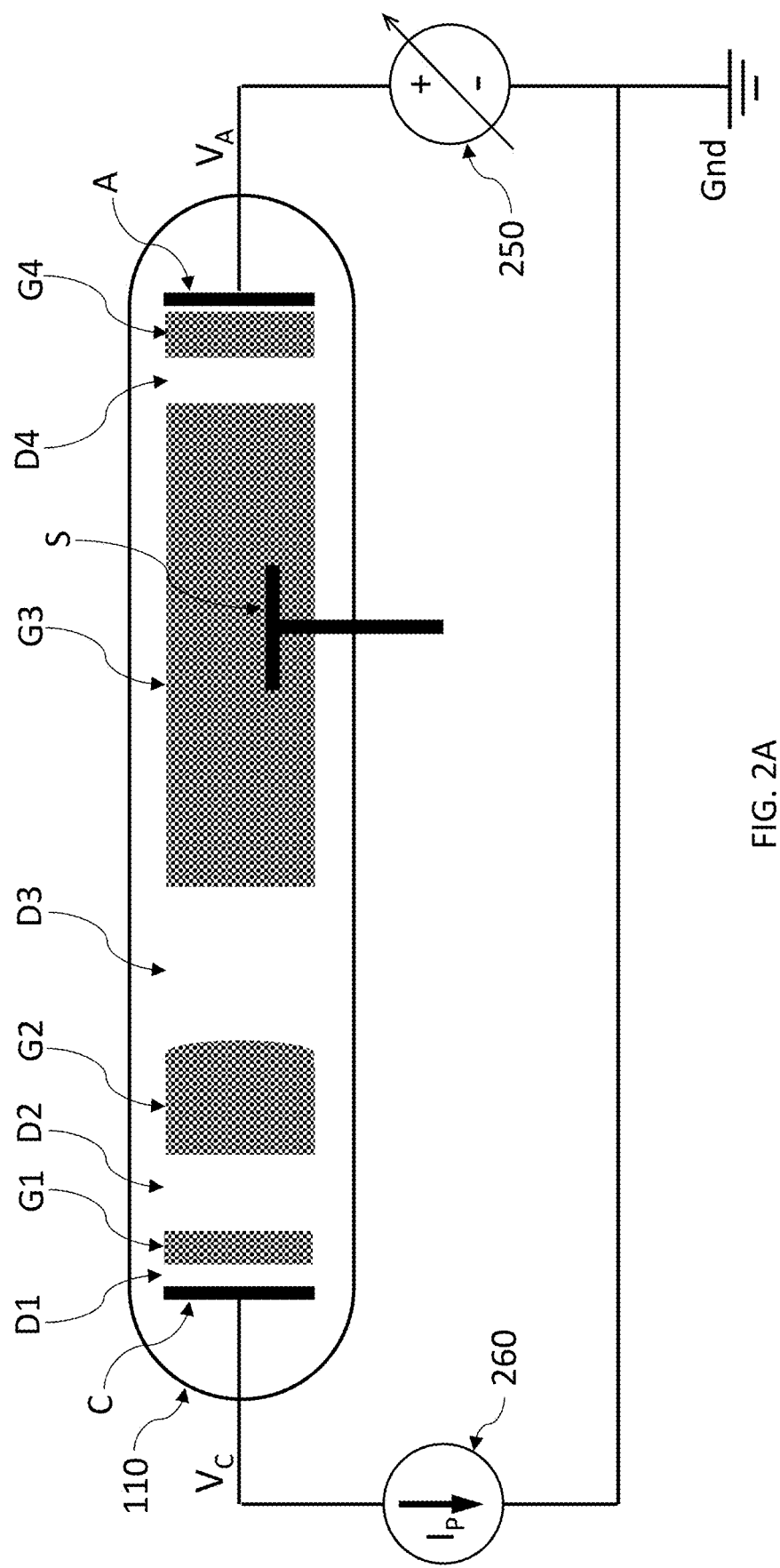
FIG. 2A shows a simplified schematic view of a DC plasma processing system according to an embodiment of the present disclosure comprising means to control a surface potential of the stage.

FIG. 2A shows a simplified schematic view of a DC plasma processing system (200A) according to an embodiment of the present disclosure comprising means (250, 260) to control the surface potential of the stage, S, when electrically isolated. In other words, the means (250, 260) allow for adjustment of the floating potential, $V_{FP}$. As shown in FIG. 2A, the means (250, 260) include an adjustable DC voltage source (250) that is coupled to the anode, A, of the DC plasma reaction chamber (110), and a DC current source (260) that is coupled to the cathode, C, of the DC plasma reaction chamber (110). Accordingly, the potential, $V_A$, of the anode, A, may be controlled to be in a range from zero volts and upward (positive) with respect to the reference ground (Gnd at zero volts), and a (drain) current, Ip, that flows between the anode, A, and the cathode, C, through the reaction chamber (110) can be set by the DC current source (260). Accordingly, the potential, $V_C$, of the cathode, C, is not forced by an external DC voltage source (e.g., 150 of FIG. 1D), rather (is floating and) settles to a (negative) voltage that is based on the adjustable potential $V_A$ of the anode A, and the set current, Ip. Such configuration allows to independently control/adjust the floating potential, $V_{FP}$, while maintaining the set current, Ip, through the reaction chamber (110) constant to establish and maintain a higher level of process stability and optimization.

Figure 2B:
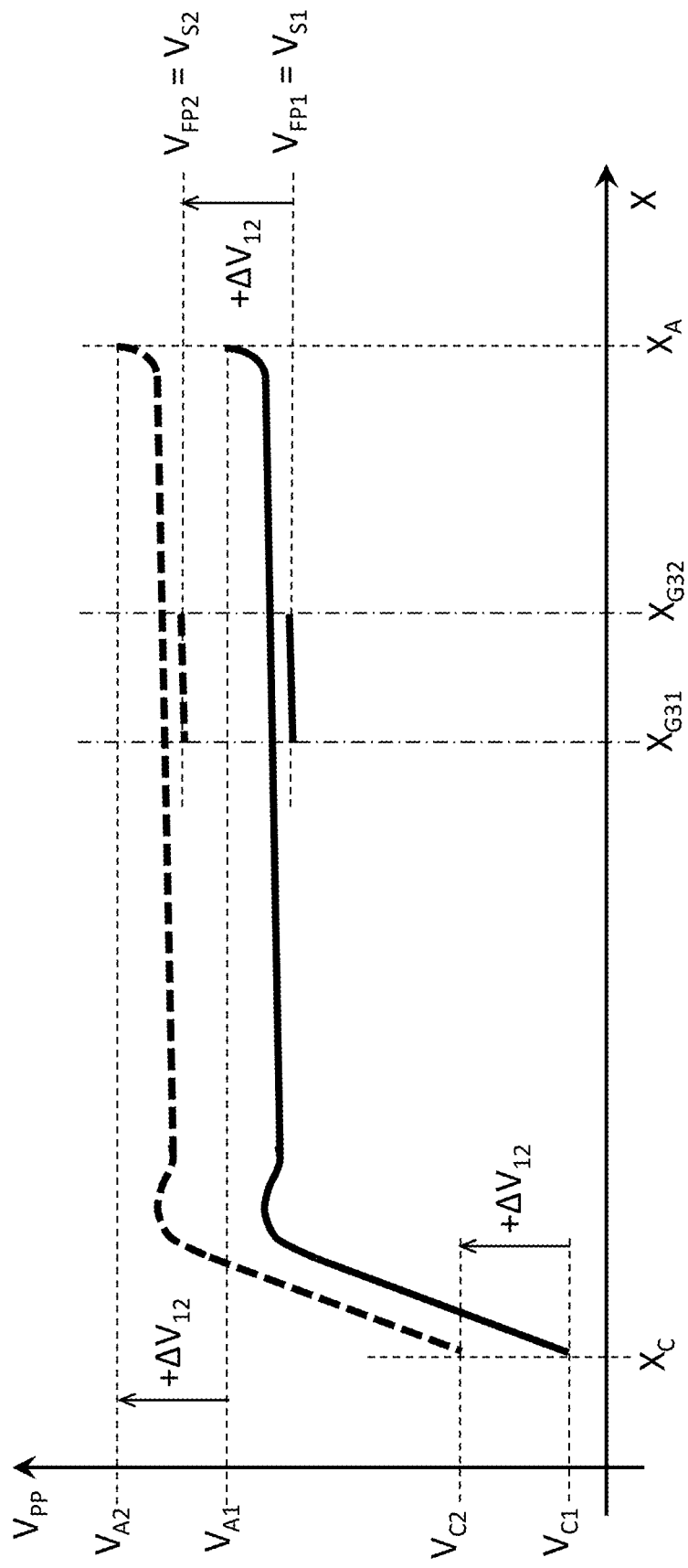
FIG. 2B shows graphs representative of control of the surface potential of the stage for the DC plasma processing system of FIG. 2A.

FIG. 2B shows two graphs representative of control of the surface potential, $V_{FP}$, of the stage, S, for the DC plasma processing system (200A) described above with reference to FIG. 2A. In particular, FIG. 2B shows two graphs distinguished by use of solid or dashed lines, each representing the variation of the plasma potential, $V_{PP}$, across the longitudinal extension, X, of the chamber (110) for two different voltages ($V_{A1}$, $V_{A2}$) applied to the anode, A, by the adjustable DC voltage source (250). As can be seen in FIG. 2B, for a positive step increase, $+\Delta V_{12}$, of the anode potential from the voltage $V_{A1}$ to the voltage $V_{A2}$, the floating potential ($V_{FP1}$, $V_{FP2}$) and the cathode potential ($V_{C1}$, $V_{C2}$) increase by the same positive step, $+\Delta V_{12}$. As a matter of fact, as shown in FIG. 2B, the entirety of plasma potential, $V_{PP}$, curve shifts positive by the step $+\Delta V_{12}$. In other words, for any longitudinal coordinate, X, in the range [$X_C$, $X_A$], a corresponding plasma potential, $V_{PP}(X)$, follows the step increase, $+\Delta V_{12}$. The same behavior applies to negative step variations applied to the anode, A, by the adjustable DC voltage source (250). In other words, control of the anode, A, potential by the adjustable DC voltage source linearly affects the plasma potential, $V_{PP}$, at any longitudinal coordinate, X, and therefore, linearly affects the floating potential, $V_{FP}$, and the voltage, $V_S$, atop the stage, S, As later described in the present disclosure, such linearity can be used in the EEMP system according to the present teachings to implement a closed loop control subsystem to automatically control the value of the floating potential, $V_{FP}$, to a preset value (e.g., zero volts) while operating the DC plasma chamber for different types of material processing.

Figure 2C:
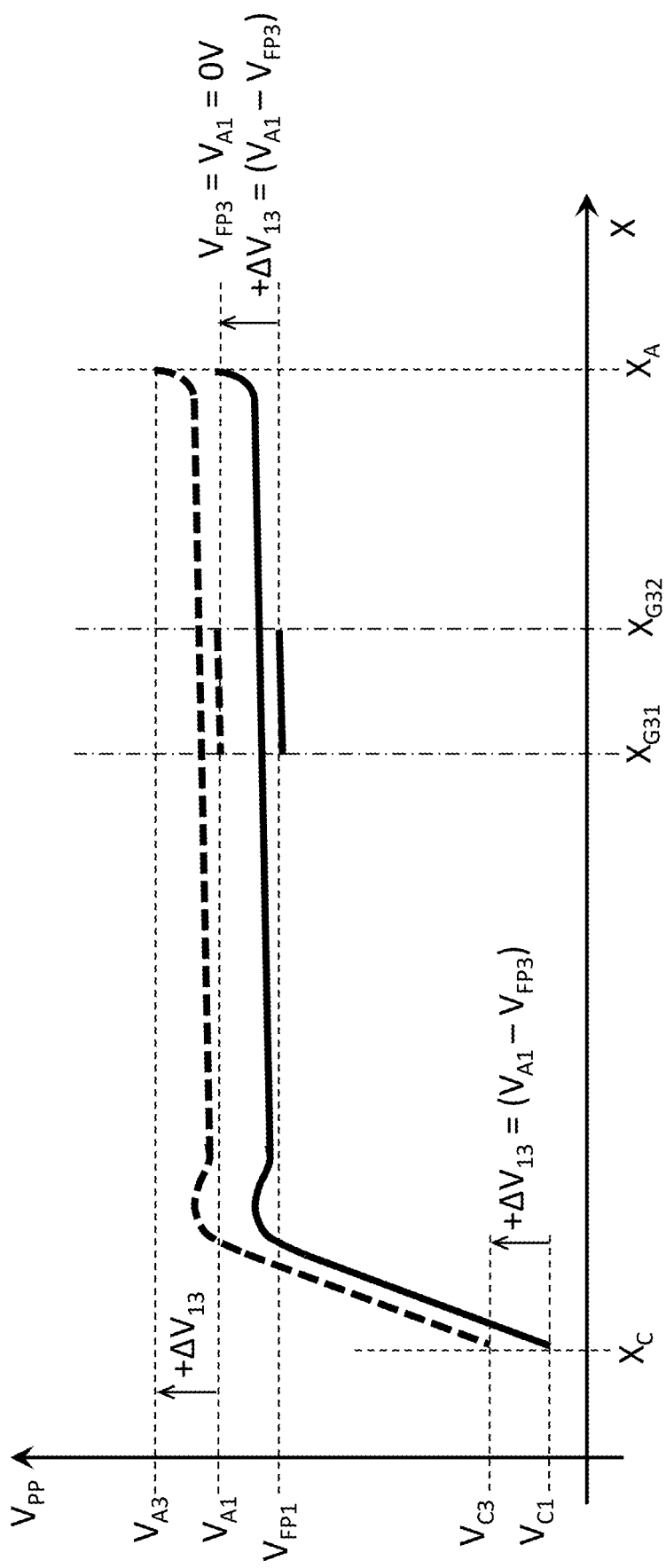
FIG. 2C shows graphs representative of adjusting the surface potential of the stage to a reference ground potential for the DC plasma processing system of FIG. 2A

FIG. 2C shows two graphs similar to the graphs described above with reference to FIG. 2B, including a specific case where the anode voltage, $V_{A1}$, is equal to zero volts (solid lines). As can be seen in FIG. 2B, the floating potential voltage for such case is equal to a negative value, $V_{FP1}$, and therefore negative with respect to (below) the plasma potential, $V_{PP}$. Furthermore, as can be seen in FIG. 2C, for a positive step increase, $+\Delta V_{13}=(V_{A1}-V_{FP1})$, of the anode potential, the floating potential can be adjusted to a value, $V_{FP3}$, that is equal to zero volts. According to an embodiment of the present disclosure, such zeroing of the floating potential, $V_{FP}$, may allow precise control of the kinetic energy of free electrons in the DC plasma to exactly (and selectively) target energy levels of atoms at the surface of a substrate (whether conductive or insulating) being processed. In other words, and with reference back to FIG. 1F, the a priori unknown floating potential that determines the energy level, $E_n$, of a nucleus of an atom targeted/selected for processing is removed by zeroing of the floating potential, $V_{FP}$. In turn, as shown in FIG. 4B later described, this allows to reference the energy level, $E_e$, of target electrons, the kinetic energy level of the free electrons in the DC plasma (e.g., $V_{KEa}$ of FIG. 1F), and the biasing voltage, $V_B$, applied to the stage, S, to the same known and fixed reference of zero volts potential, Gnd.

Figure 3A:
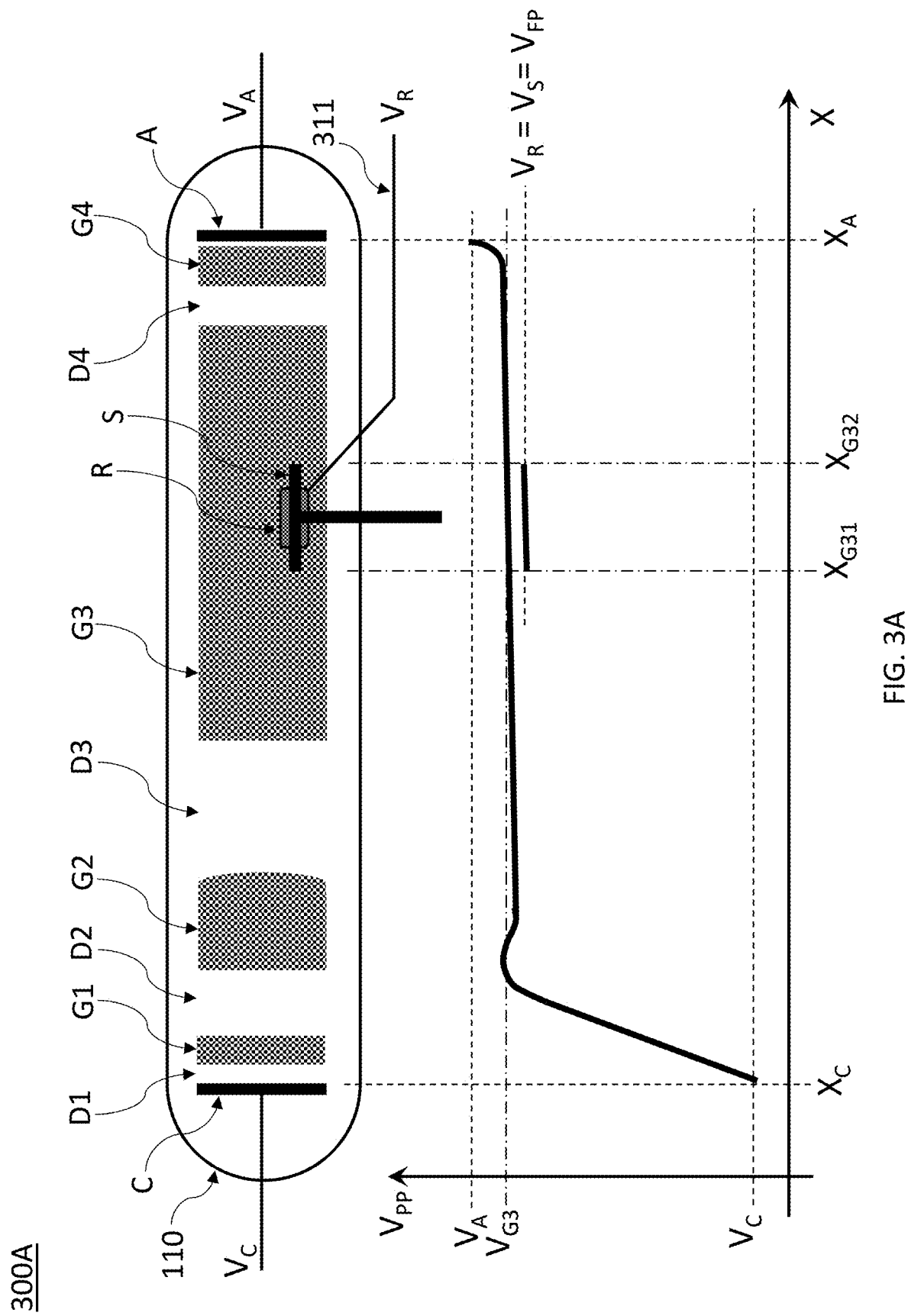
FIG. 3A shows a simplified schematic view of a DC plasma processing system according to an embodiment of the present disclosure comprising means to control a surface potential of the stage and means to measure the surface potential.

FIG. 3A shows a simplified schematic view of a DC plasma processing system (300A) according to an embodiment of the present disclosure comprising means (250, 260 of FIG. 2A) to control a surface potential of the stage, S, and means (R, 311, $V_R$ of FIG. 3A) to measure the surface potential, $V_S$ (e.g., floating potential, $V_{FP}$) atop the stage. As understood by a person skilled in the art, the system (300A) represents an improvement over the system (200A) described above with reference to FIG. 2A by adding the means (R, 311, $V_R$) to measure the surface potential, $V_S$, or in other words, to measure the (surface) floating potential, $V_{FP}$ atop the stage. By enabling such measurement of the floating potential, $V_{FP}$, adjustment of the DC voltage source (250) as described above with reference to FIGS. 2A-2C may be performed while monitoring/measuring the surface potential, $V_{FP}$. This in turn allows precise control of the floating potential, $V_{FP}$, including, for example, to zero such potential ($V_{FP}=0$ volts).

With continued reference to FIG. 3A, the means (R, 311, $V_R$) includes a reference plate, R, that is placed within DC plasma chamber (110) at a same (longitudinal coordinate) segment [$X_{G31}$, $X_{G32}$] as the stage, S. The reference plate, R, may be fabricated from any conductive material capable of withstanding (internal) operating conditions of the chamber (110), and may have any planar shape, including planar shapes according to, for example, a square, rectangle, circle, pentagon, trapezoid or other. Because the reference plate, R, is arranged in the same region of the plate, S, and therefore in a region of a same substantially constant plasma potential, $V_{PP}$, the reference plate, R, sees a same floating potential, $V_{FP}$, as the stage, S. In other words, by measuring the (surface) potential, $V_R$, at the reference plate, R, the floating potential at the stage, S, can be determined. An insulated conductive wire (311) attached to the reference plate, R, may be used to route/couple the potential, $V_R$, to measurement electronics (e.g., transducer) placed outside the chamber (110). It should be noted that such measurement electronics should not provide a DC current path to the plasma through plate R.

With continued reference to FIG. 3A, placement of the reference plate, R, may be at any longitudinal extension of the chamber (110) within the segment [$X_{G31}$, $X_{G32}$] that is technically feasible and practical. As the chamber, S, may include an access door adjacent the stage, S, on one side of the chamber (110), in some exemplary embodiments the reference plate, R, may be arranged against, or in the vicinity, of a wall of the chamber (110) that is on an opposite side of the access door and stage, S. Furthermore, according to an exemplary embodiment, a center of the reference plate, R, and a center of the stage, S, (e.g., intersection of the two segments that make the T shape of the stage as shown in the figures) may be contained within a line that is perpendicular to the axial direction (e.g., centerline, direction of longitudinal extension) of the chamber (110). Applicants of the present disclosure have verified high accuracy of the means (R, 311, $V_R$) in tracking of the floating potential of the stage, S.

Figure 3B:
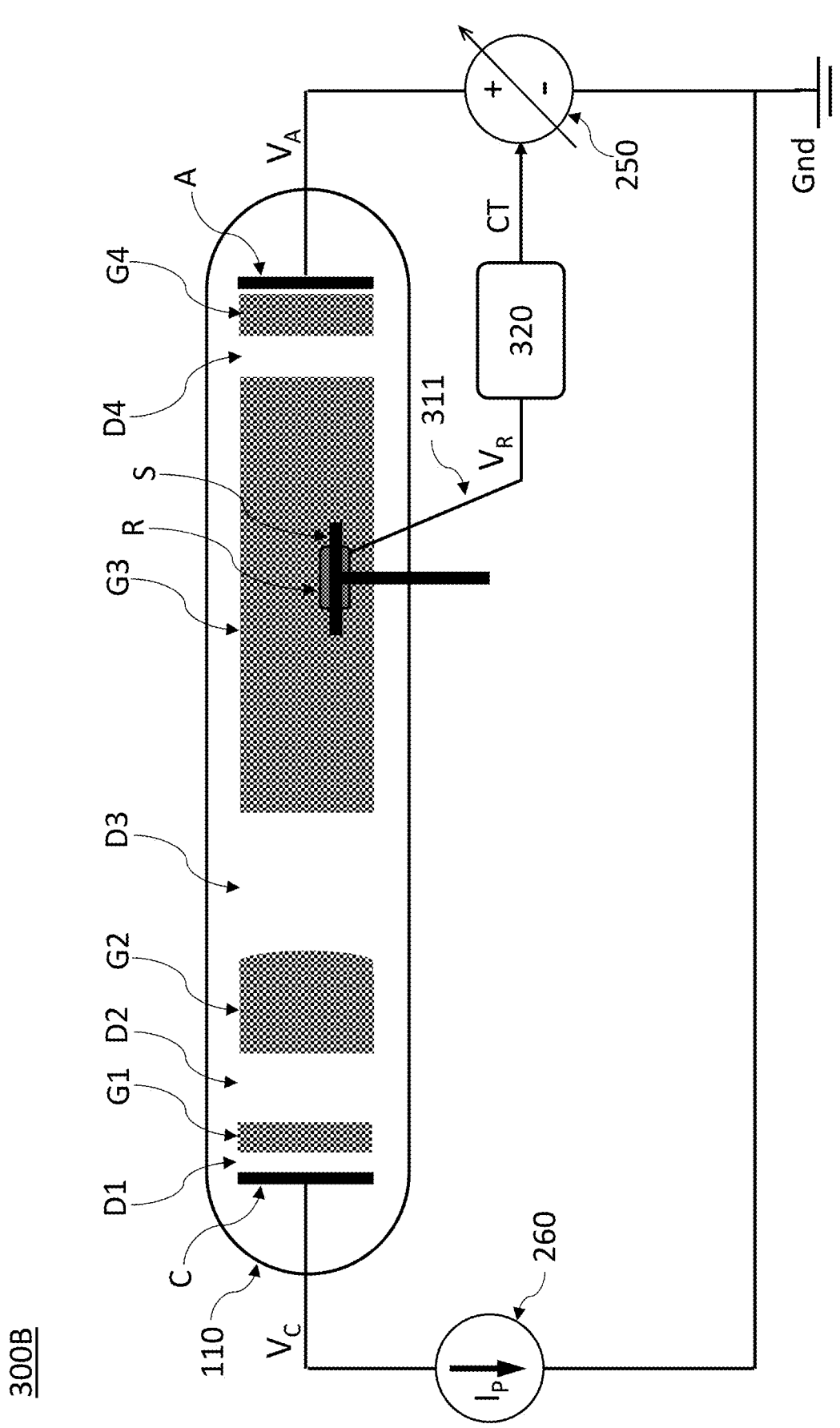
FIG. 3B shows a simplified schematic view of a DC plasma processing system according to an embodiment of the present disclosure that is based on the system of FIG. 3A with added means for automatic control of the surface potential.

FIG. 3B shows a simplified schematic view of a DC plasma processing system (300B) according to an embodiment of the present disclosure that is based on the system (300A) of FIG. 3A with added means (320, CT) for automatic control of the surface potential, $V_{FP}$, at the stage, S. The means (320, CT) includes control electronics (320) configured to implement a closed loop control system to automatically control the value of the floating potential, $V_{FP}$, at the stage, S, to a preset value (e.g., zero volts) while operating the DC plasma chamber for different types of processing. In particular, as shown in FIG. 3B, the control electronics (320) takes the (surface) potential, $V_R$, of the reference plate, R, as input via a coupling provided by the insulated conductive wire (311), and generates therefrom a control (error) signal, CT, to the adjustable DC voltage source (250) to adjust the voltage, $V_A$, provided to the anode, A, and therefore, as described above with reference to FIGS. 2A-2C, adjust the floating potential, $V_{FP}$, at the stage, S. The control (error) signal, CT, may be generated with respect to a desired target/preset value of the floating potential, $V_{FP}$, such as, for example, zero volts. A person skilled in the art is well aware of design techniques for implementing the control electronics (320) which are outside the scope of the present disclosure. In particular, a person skilled in the art is well aware of using operational amplifiers or error amplifiers in such control electronics (320), wherein inputs of such amplifiers may be coupled to the potential, $V_R$, and to the desired target/preset value (e.g., zero volts) of the floating potential, $V_{FP}$, to generate an error signal (e.g., CT) based on a difference of the inputs.

Figure 4A:
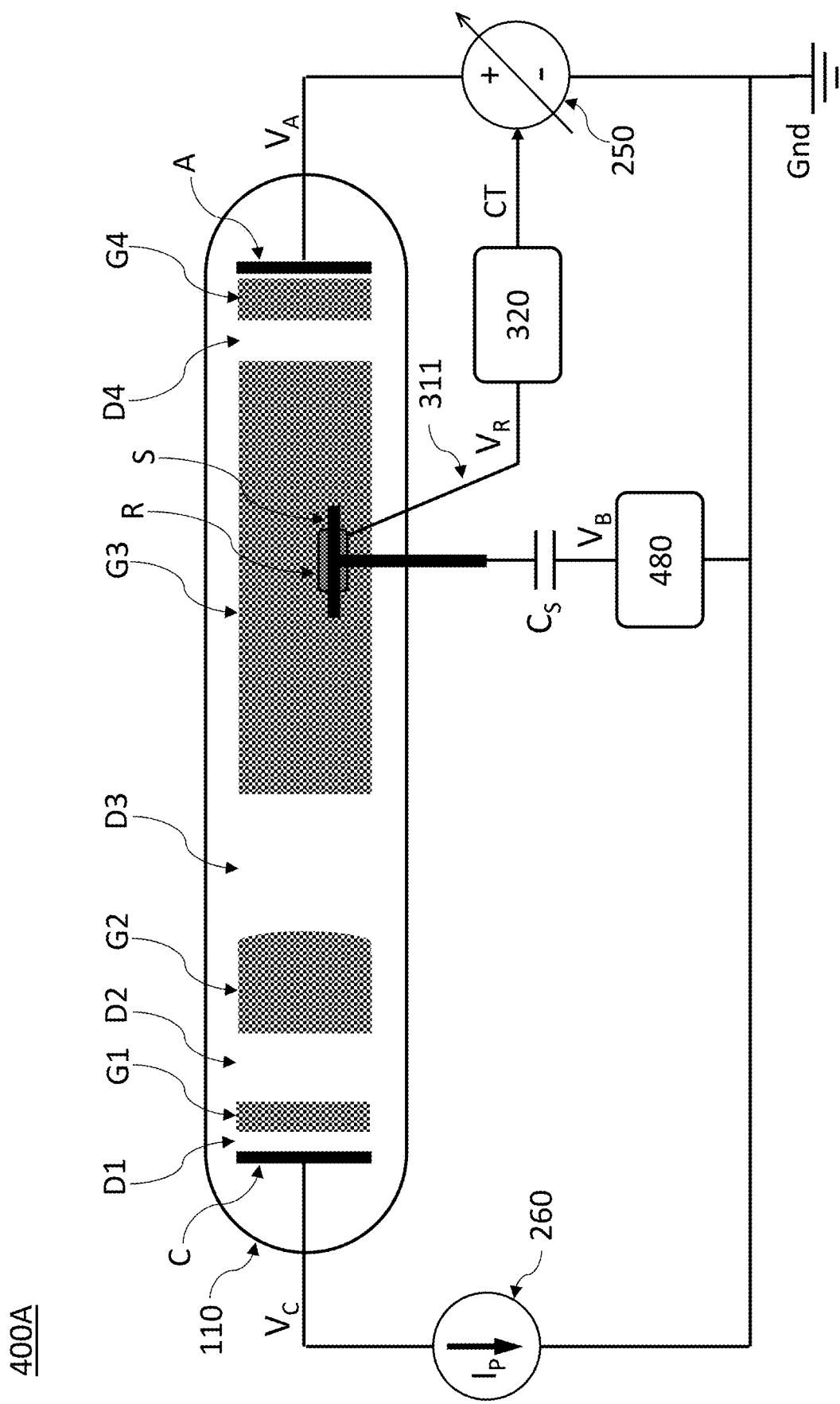
FIG. 4A shows a simplified schematic view of a DC plasma processing system according to an embodiment of the present disclosure that is based on the system of FIG. 3B with added means for biasing of the stage.
Figure 4B:
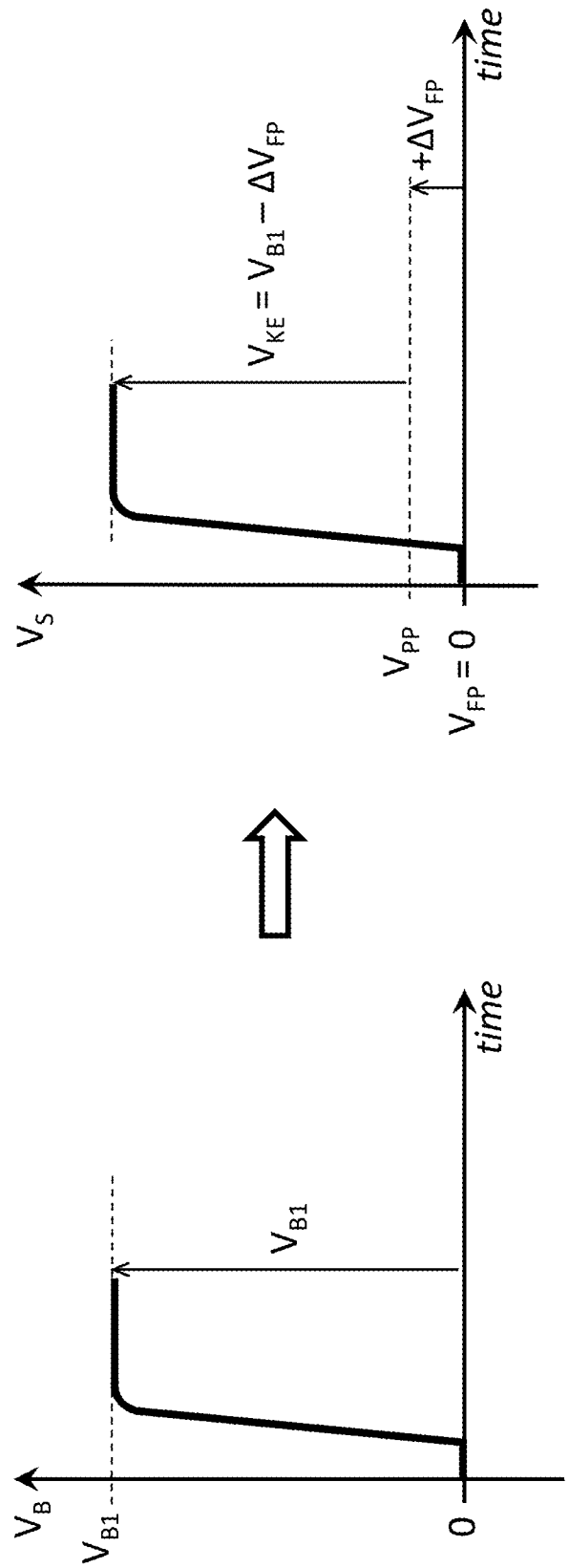
FIG. 4B shows an exemplary biasing signal provided to the stage of the DC plasma processing system of FIG. 4A and a corresponding potential generated at the surface of the stage.

FIG. 4A shows a simplified schematic view of a DC plasma processing system (400A) according to an embodiment of the present disclosure that is based on the system of FIG. 3B with added biasing means ($C_S$, 480) for biasing of the stage, S. In particular, the biasing means ($C_S$, 480) includes a biasing signal generator (480) that is coupled to the stage, S, through a capacitor, $C_S$, of the biasing means. In other words, a biasing signal, $V_B$, generated at an output of the biasing signal generator (480) is capacitively coupled to the stage, S, through the capacitor, $C_S$. As previously described in the present disclosure, such capacitive coupling may allow removal of any DC current path from or into the DC plasma chamber (110), thereby preventing any undesired perturbation of operating conditions of the chamber (110). It should be noted that the biasing signal generator (480) may include, for example, a programmable waveform generator configured to output a waveform of the biasing signal, $V_B$, according to desired characteristics, including for example, amplitude, frequency, duty cycle and/or rising/falling edges/slopes. It is further noted that the stage, S, may include a first conductive portion (e.g., vertical lead connected to the capacitor $C_S$) for electrical coupling of the biasing signal, $V_B$, to the stage, S, and a second portion of the stage (e.g., horizontal support plate) that may include conductive and/or insulating material.

FIG. 4B shows an exemplary biasing signal, $V_{B1}$, provided to the stage, S, of the DC plasma processing system (400A) of FIG. 4A and a corresponding surface potential, $V_S$, generated at the surface of the stage, S. As can be clearly understood by a person skilled in the art, the graphs shown in FIG. 4B correspond to a configuration of the system (400) wherein the floating potential, $V_{FP}$, is adjusted or controlled to be at zero volts. Accordingly, and in view of (or in contrast to) the above description with reference to FIG. 1E, the (kinetic) energy of the free electrons and/or ions attracted to the surface of the stage, S, or a substrate thereupon, is based on the potential difference $V_{KE}=(V_{B1}-\Delta V_{FP})$, with $\Delta V_{FP}=(V_{PP}-V_{FP})$. Accordingly, since in practical substrate processing applications using a DC plasma chamber, a value of $\Delta V_{FP}$ may be substantially smaller (e.g., ratio of 1/50 or smaller) than the value of $V_{KE}$ (e.g., based on the energy level $E_e$ of a target electron per FIG. 4C); an approximation $V_{KE}=V_{B1}$ may be considered reasonable. In turn, this allows a simple and straightforward generation of the biasing signal, $V_{B1}$, provided to the stage, S, for implementation of the electron enhanced material processing (EEMP) according to the teachings of the present disclosure that exactly and selectively targets the energy level of an atom (e.g., bound electron) at the surface of the substrate.

With further reference to FIG. 4A and FIG. 4B, it is noted that excitation of the energy levels of the atoms at the surface of the stage, S, or at the surface of a substrate arranged atop the stage, S, may be primarily based on an instantaneous change in the surface potential, $V_S$. Accordingly, excitation of the energy levels may be accomplished immediately at the end of the transition of the biasing voltage to the target value, $V_{B1}$, or in other words, at the end of the slope shown in FIG. 4B.

Figure 4C:
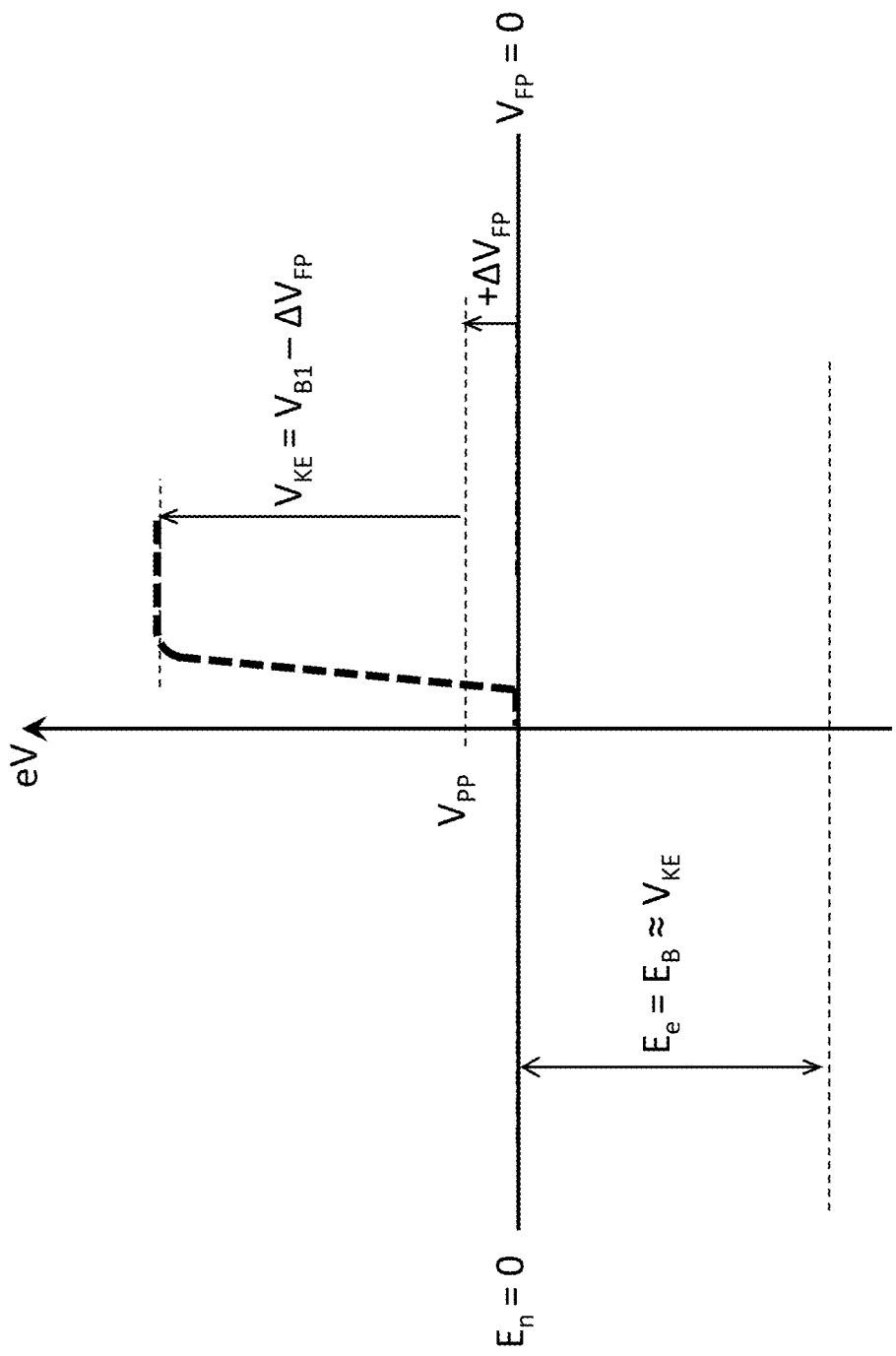
FIG. 4C shows exemplary energy levels of atoms at a surface of the stage.

FIG. 4C shows exemplary energy levels of atoms at a surface of the stage, S, of the of the DC plasma processing system (400A) of FIG. 4A. FIG. 4C highlights benefits of the electron enhanced material processing (EEMP) according to the teachings of the present disclosure that allows adjustments to exactly and selectively target the energy level of an atom (e.g., $Ee \approx V_{KE}$ per FIG. 4C) at the surface of the substrate based on the zeroing of the floating potential, $V_{FP}$, according the above description with reference to FIGS. 2A-2C, further based on the reference plate, R, according to above description with reference to FIG. 3A, further based on the (optional) closed loop control system provided by the control electronics (320) according to the above description with reference to FIG. 3B, and further based on the capacitive coupling of the biasing signal, $V_B$, provided by the biasing signal generator (480) according to the above description with reference to FIG. 4A.

Figure 5:
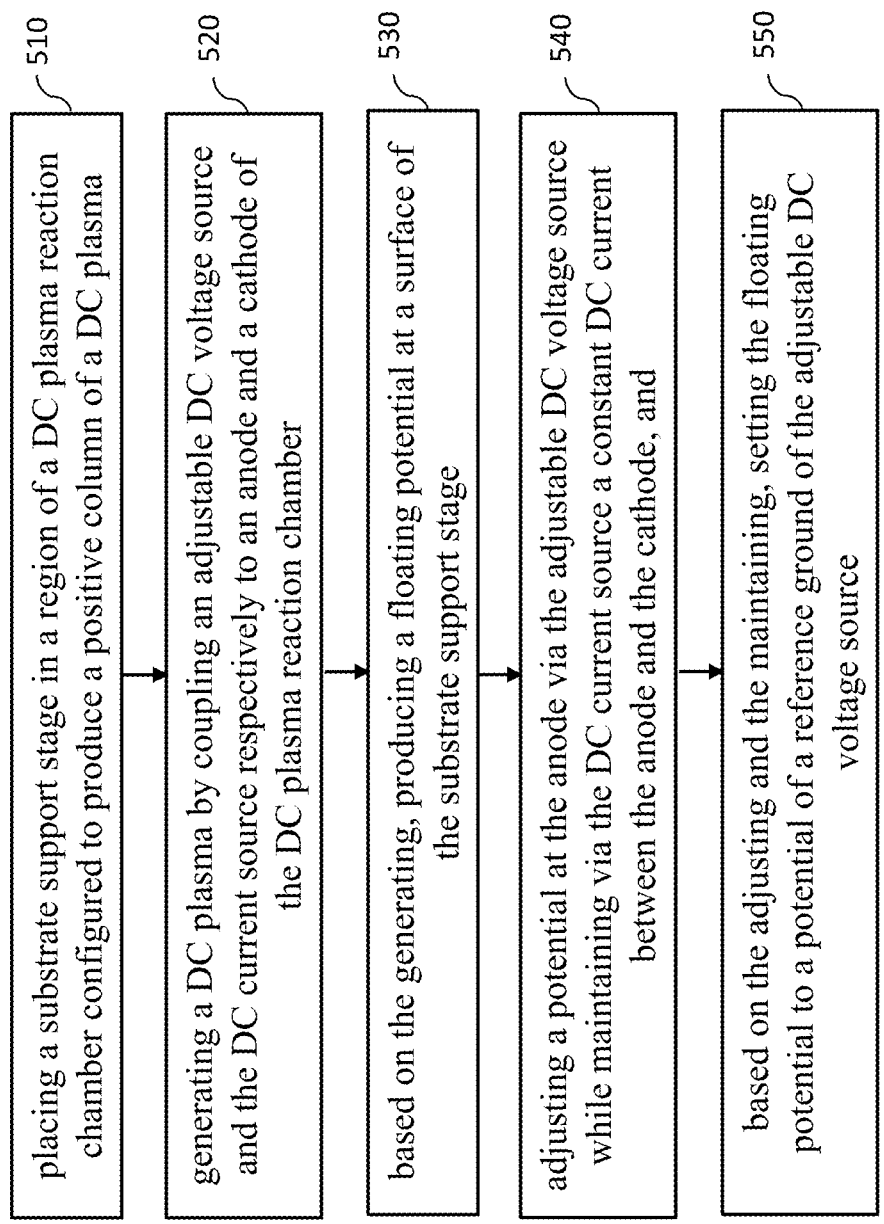
FIG. 5 is a process chart showing various steps of a method according to an embodiment of the present disclosure for processing a surface of a substrate.

FIG. 5 is a process chart (500) showing various steps of a method according to an embodiment of the present disclosure for processing a surface of a substrate. As shown in FIG. 5, such steps comprise: placing a substrate support stage in a region of a DC plasma reaction chamber configured to produce a positive column of the DC plasma, according to step (510); generating a DC plasma by coupling an adjustable DC voltage source and a DC current source respectively to an anode and a cathode of the DC plasma reaction chamber, according to step (520); based on the generating, producing a floating potential at a surface of the substrate support stage, according to step (530); adjusting a potential at the anode via the adjustable DC voltage source while maintaining via the DC current source a constant DC current between the anode and the cathode, according to step (540); and based on the adjusting and the maintaining, setting the floating potential to a potential of a reference ground of the adjustable DC voltage source, according to step (550).

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. A direct-current (DC) plasma system for processing of a substrate, comprising:
a DC plasma reaction chamber configured to contain a DC plasma that is generated between an anode and a cathode of the DC plasma reaction chamber;
an adjustable DC voltage source having an output that is electrically coupled to the anode;
a DC current source that is electrically coupled to the cathode;
a substrate support stage arranged in a region of the DC plasma reaction chamber that contains a positive column of the DC plasma;
a reference plate made of a conductive material arranged in the region of the DC plasma reaction chamber that contains the positive column so that a surface potential of the reference plate is equal to the floating potential; and
control electronics electrically coupled to the reference plate via an insulated conductive wire,
wherein
the adjustable DC voltage source and the DC current source are electrically coupled to a reference ground,
the adjustable DC voltage source is configured to adjust, during processing of the substrate, an electrical potential at the anode to set a floating potential at a surface of the substrate support stage to a potential of the reference ground, and
the control electronics is configured to generate an error signal based on a difference between the surface potential of the reference plate and the potential of the reference ground.

2. The direct-current (DC) plasma system of claim 1, wherein:
the DC current source is configured to set, during the processing of the substrate, a constant DC current that flows between the anode and the cathode, the constant DC current configured to generate the DC plasma.

3. The direct-current (DC) plasma system of claim 2, wherein:
the electrical potential at the anode and the constant DC current in combination establish a potential at the cathode.

4. The direct-current (DC) plasma system of claim 2, wherein:
the electrical potential at the anode is adjustable independently from the constant DC current.

5. The direct-current (DC) plasma system of claim 1, wherein:
the substrate support stage and the reference plate are arranged within a segment along a longitudinal extension of the DC plasma reaction chamber.

6. The direct-current (DC) plasma system of claim 5, wherein:
a center of the substrate support stage and a center of the reference plate are contained within a line that is perpendicular to a direction of the longitudinal extension.

7. The direct-current (DC) plasma system of claim 1, wherein:
the control electronics comprises an operational amplifier or an error amplifier.

8. The direct-current (DC) plasma system of claim 1, wherein:
the adjustable DC voltage source is configured to receive the error signal and adjust the electrical potential at the anode based on a value of the error signal.

9. The direct-current (DC) plasma system of claim 8, wherein:
the adjustable DC voltage source, the reference plate and the control electronics are configured to provide a closed loop control system to maintain the floating potential to the potential of the reference ground.

10. A direct-current (DC) plasma system for processing of a substrate, comprising:
a DC plasma reaction chamber configured to contain a DC plasma that is generated between an anode and a cathode of the DC plasma reaction chamber;
an adjustable DC voltage source having an output that is electrically coupled to the anode;
a DC current source that is electrically coupled to the cathode;
a substrate support stage arranged in a region of the DC plasma reaction chamber that contains a positive column of the DC plasma;
a reference plate made of a conductive material arranged in the region of the DC plasma reaction chamber that contains the positive column so that a surface potential of the reference plate is equal to the floating potential; and
a biasing signal generator that is capacitively coupled to the substrate support stage,
wherein
the adjustable DC voltage source and the DC current source are electrically coupled to a reference ground,
the adjustable DC voltage source is configured to adjust, during processing of the substrate, an electrical potential at the anode to set a floating potential at a surface of the substrate support stage to a potential of the reference ground,
the biasing signal generator is configured to generate a biasing signal having a voltage level that is referenced to the potential of the reference ground, the biasing signal capacitively coupled to the substrate support stage, and
the biasing signal is configured to control a surface potential of the substrate support stage.

11. The direct-current (DC) plasma system of claim 10, wherein:
the biasing signal generator is configured to control waveform characteristics of the biasing signal, the waveform characteristics comprising the voltage level, a frequency, a duty cycle, a rising edge, or a falling edge.

12. The direct-current (DC) plasma system of claim 10, wherein:
when the voltage level of the biasing signal is zero volts, the surface potential of the substrate support stage is at zero volts, the energy level of free electrons in the DC plasma is at zero volts, and the energy level of nuclei of atoms at a surface of the substrate is at zero volts.

13. The direct-current (DC) plasma system of claim 12, wherein:
when the voltage level of the biasing signal is increased by a positive voltage step, the surface potential of the substrate support stage is increased by the same positive voltage step, the energy level of the free electrons is increased in proportion to the positive voltage step.

14. The direct-current (DC) plasma system of claim 13, wherein:
   the positive voltage step is selectable, during the processing of the substrate, to increase the energy level of the free electrons to an energy level of electrons bonded to the nuclei.

15. The direct-current (DC) plasma system of claim 10, wherein:
   the DC current source is configured to set, during the processing of the substrate, a constant DC current that flows between the anode and the cathode, the constant DC current configured to generate the DC plasma.

16. The direct-current (DC) plasma system of claim 15, wherein:
   the electrical potential at the anode and the constant DC current in combination establish a potential at the cathode.

17. The direct-current (DC) plasma system of claim 15, wherein:
   the electrical potential at the anode is adjustable independently from the constant DC current.

18. The direct-current (DC) plasma system of claim 10, wherein:
   the substrate support stage and the reference plate are arranged within a segment along a longitudinal extension of the DC plasma reaction chamber.

19. The direct-current (DC) plasma system of claim 18, wherein:
   a center of the substrate support stage and a center of the reference plate are contained within a line that is perpendicular to a direction of the longitudinal extension.

* * * * *